US012579561B2

(12) United States Patent
Saad et al.

(10) Patent No.: US 12,579,561 B2
(45) Date of Patent: Mar. 17, 2026

(54) EFFECTIVE STOCK KEEPING UNIT (SKU) MANAGEMENT SYSTEM

(71) Applicant: Adobe Inc., San Jose, CA (US)

(72) Inventors: Michele Saad, Austin, TX (US); Matthew Cecil Zimmerman, Austin, TX (US)

(73) Assignee: ADOBE INC., San Jose, CA (US)

( * ) Notice: Subject to any disclaimer, the term of this patent is extended or adjusted under 35 U.S.C. 154(b) by 0 days.

(21) Appl. No.: 18/888,379

(22) Filed: Sep. 18, 2024

(65) Prior Publication Data

US 2025/0014081 A1 Jan. 9, 2025

Related U.S. Application Data

(62) Division of application No. 17/712,406, filed on Apr. 4, 2022, now Pat. No. 12,169,856.

(51) Int. Cl.
| | |
|---|---|
| *G06F 7/00* | (2006.01) |
| *G06F 16/22* | (2019.01) |
| *G06F 16/245* | (2019.01) |
| *G06F 16/28* | (2019.01) |
| *G06Q 30/0601* | (2023.01) |
| *H03M 7/30* | (2006.01) |

(52) U.S. Cl.
CPC ..... *G06Q 30/0603* (2013.01); *G06F 16/2272* (2019.01); *G06F 16/245* (2019.01); *G06F 16/285* (2019.01); *H03M 7/30* (2013.01)

(58) Field of Classification Search
CPC . G06Q 30/0603; G06F 16/245; G06F 16/285; G06F 16/2272; H03M 7/30
USPC .................................. 707/600–899; 705/26.1
See application file for complete search history.

(56) References Cited

U.S. PATENT DOCUMENTS

| | | | |
|---|---|---|---|
| 8,352,259 B2 * | 1/2013 | Bogdanov | G10L 25/48 704/231 |
| 2006/0149533 A1 | 7/2006 | Bogdanov | |

* cited by examiner

*Primary Examiner* — Isaac M Woo
(74) *Attorney, Agent, or Firm* — Shook, Hardy & Bacon, L.L.P.

(57) ABSTRACT

An effective stock keeping unit (SKU) management system encodes catalog data into an embedding per catalog item. An embedding space is created by encoding catalog item data into an embedding per catalog item. The embedding is created by generating an index, where a number of rows represents a number of catalog items and a number of columns represents a number of fields associated with each catalog item. The index is then denormalized using customer groups and transformed by compressing the number of columns, to create the embedding space. In some configuration, a machine learning model is trained using catalog data. In the embedding space, item similarity is encoded by clustering catalog SKUs into groups in the embedding space, by placing similarly related items close to each other in the embedding space. Catalog items are then searched for in the embedding, with the closest clusters searched for a particular catalog item.

15 Claims, 7 Drawing Sheets

600

602 — ENCODING CATALOG ITEM DATA INTO FINGERPRINTS FOR EACH CATALOG ITEM

604 — STORING THE FINGERPRINTS IN A MATRIX

606 — COMPRESSING THE MATRIX TO CREATE A THIN MATRIX

608 — TRAINING AN AUTOENCODER ON CATALOG DATA TO DERIVE THE FINGERPRINTS

610 — CLUSTERING THE FINGERPRINTS INTO GROUPS IN AN EMBEDDING SPACE

612 — SEARCHING FOR AT LEAST ONE CATALOG ITEM USING THE FINGERPRINTS

600

602 — ENCODING CATALOG ITEM DATA INTO FINGERPRINTS FOR EACH CATALOG ITEM

604 — STORING THE FINGERPRINTS IN A MATRIX

606 — COMPRESSING THE MATRIX TO CREATE A THIN MATRIX

608 — TRAINING AN AUTOENCODER ON CATALOG DATA TO DERIVE THE FINGERPRINTS

610 — CLUSTERING THE FINGERPRINTS INTO GROUPS IN AN EMBEDDING SPACE

612 — SEARCHING FOR AT LEAST ONE CATALOG ITEM USING THE FINGERPRINTS

700

MEMORY

712

PROCESSOR(S)

714

PRESENTATION
COMPONENT(S)

716

710

I/O PORT(S)

718

I/O COMPONENTS

720

POWER SUPPLY

722

EFFECTIVE STOCK KEEPING UNIT (SKU) MANAGEMENT SYSTEM

This application is a Divisional of U.S. patent application Ser. No. 17/712,406 filed Apr. 4, 2022, which is incorporated herein by reference in its entirety.

BACKGROUND

The past few decades have seen a paradigm shift away from "brick and mortar" stores toward online shopping at e-commerce sites. Virtually every company that sells products has an online presence via a website that allows customers to view and purchase products being offered. Such e-commerce sites require data management systems to track inventory and allow users to electronically search the inventory. The number of items available in an inventory can pose challenges for designing an efficient data management system. For instance, many merchants offer catalogs of various sizes, product categories, and price points, often to customers world-wide. Every catalog item is identified by a stock keeping unit (SKU) which can change with variables such as size, color, special pricing for specific customer categories, and more. Each customer group receives their own catalog and each catalog can offer different prices which can vary for volume discounts. When a catalog item is marked down, offered as part of a promotion, or is offered in multiple colors, each variant is identified by a different SKU. The combination of large customer groups with large catalogs results in an exploding number of effective SKUs for the data management system to store, track, and manage. Online merchants can potentially have billions of SKUs that need to be tracked and inventoried by the data management system. Shortcomings in existing SKU and search technology can result in the consumption of an unnecessary amount of storage and computing resources such as increased memory storage, throughput, network packet generation, and computing time.

SUMMARY

Embodiments of the present invention relate to, among other things, an effective SKU management system that encodes and clusters catalog data to enable searches for catalog items. The catalog data is encoded to produce an embedding, or fingerprint for each catalog item. The fingerprints are stored in a matrix that is then compressed to create a thin matrix. After the thin matrix has been created an autoencoder is trained on the catalog data to derive the fingerprints. The autoencoder can be trained using a machine learning model. The fingerprints are then clustered into groups in an embedding space. The embedding space can then be searched for at least one catalog item using the fingerprints. The searching time is more efficient because the encoding, clustering, and compression reduce the locations that are searched and those locations are searched more efficiently.

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

BRIEF DESCRIPTION OF THE DRAWINGS

The present invention is described in detail below with reference to the attached drawing figures, wherein.

DETAILED DESCRIPTION

Definitions

Figure 1:
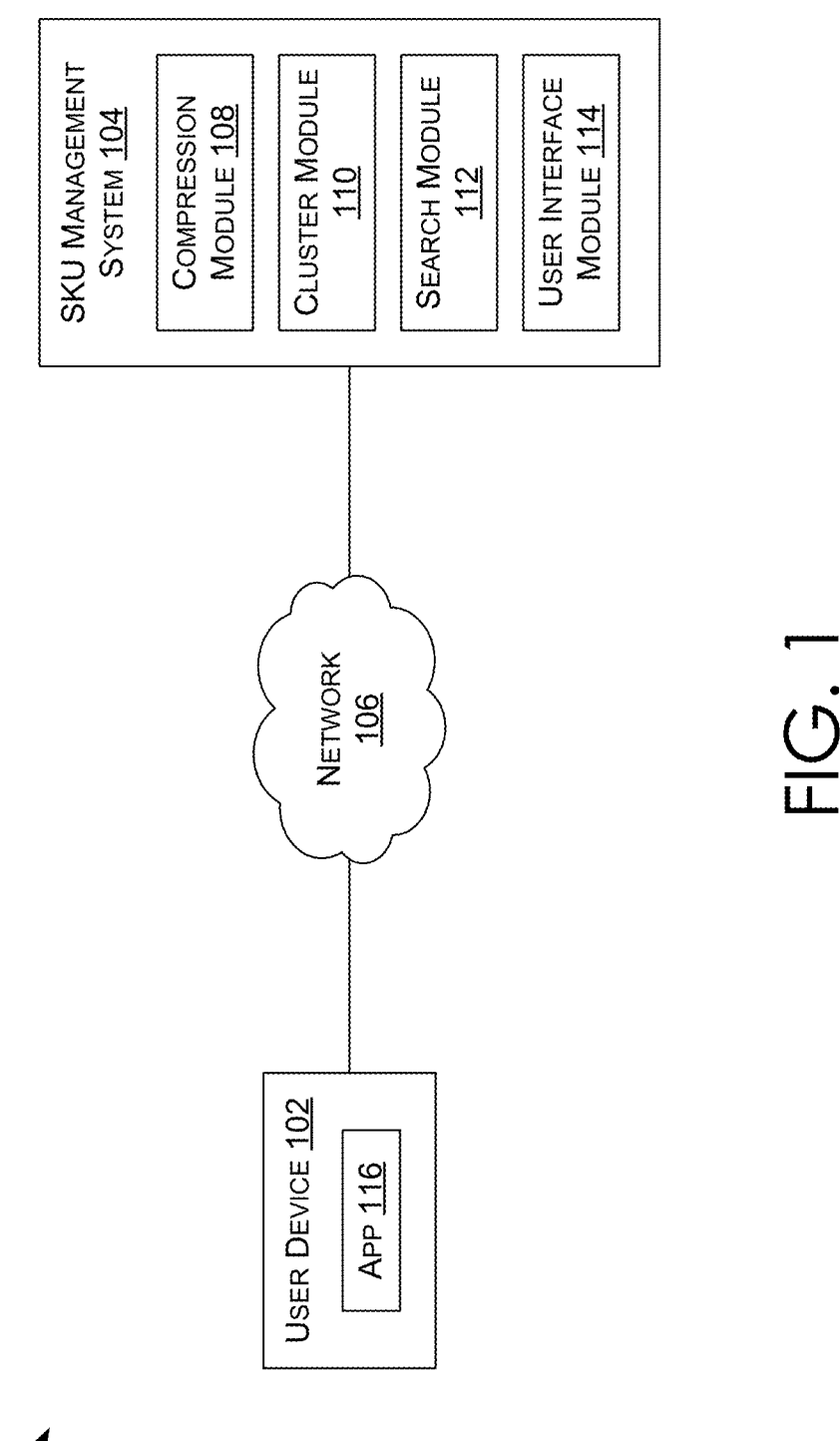
FIG. 1 is a block diagram illustrating an exemplary system in accordance with some implementations of the present disclosure.

Various terms are used throughout this description. Definitions of some terms are included below to provide a clearer understanding of the ideas disclosed herein.

As used herein, a "SKU" is used to refer to a stock keeping unit, which is a scannable bar code. The SKU is composed of an alphanumeric combination of approximately eight characters. The SKU provides a code that tracks price, product details, and manufacturer.

The term "autoencoder" is used herein to refer to a type of artificial neural network used to learn efficient codings of unlabeled data. The encoding is validated and refined by attempting to regenerate the input from the encoding. The autoencoder learns a representation, the encoding, for a set of data, typically for dimensionality reduction, by training the network to ignore insignificant data, or noise.

As used herein, a "feedforward neural network" is an artificial neural network where connections between the nodes do not form a cycle.

As used herein, a "one-hot binary vector" is created by removing an integer encoded variable and adding a new binary variable for each unique integer value.

The term "backpropagation" is used herein to refer to a method that propagates the total loss back into the neural network to know how much of the loss of every node is responsible for. This knowledge is then used to update the weights so as to minimize loss. This is accomplished by assigning nodes with high error rates lower weights. Conversely, nodes with low error rates are assigned higher rates.

Overview

Ecommerce merchant span a wide range of sizes, as measured by gross merchandizing value (GMV), catalog size, product categories, online traffic, or global reach. All ecommerce merchants face an expanding catalog problem that not only consumes memory resources, but poses computational challenges to performing operations in real time or near real time. E-Commerce sites require data management systems to track inventory and allow users to electronically search the inventory. The number of items offered can pose challenges for data management and designing an efficient data management system. Some ecommerce merchants have catalogs with as many as 1.6 billion effective SKUs, with many merchants having effective SKUs in the millions. Storing billions of SKUs can result in adding significant additional memory, regardless of whether that memory is physical memory or cloud storage.

Merchant catalogs consist of a certain number of SKUs. In addition, many merchants, especially those in the business-to-business space, have multiple customer groups to which they market disparate versions of their online catalogs. Price is the most basic difference, as many merchants offer volume price discounts. Other prices vary with the different product features offered to different customer groups. A large number of customer groups coupled with a large number of catalogs produces an exploding number of SKUs for a merchant to track. The problem of storing an exploding number of SKUs poses a memory storage problem that constantly increases.

The catalog scalability problem poses technical problems because storing catalog data, such as SKUs, in an index takes increased storage space as the index size grows. As the size of the index grows the search time to find a particular catalog item, such as a specific SKU, increases. Increasing catalog sizes pose challenges for data management systems. Denormalizing the data in the index to reduce search and retrieval time only explodes the size of the index and does not solve the technical problem of storage space and can worsen retrieval times for catalog items. In addition, denormalizing the data in the index can pose further technical problems as the index then needs to be split between multiple storage nodes with the retrieval speed remaining a function of the size of the index. As the size of the index increases retrieval speed decreases, producing increased consumption of computing resources. Devoting more resources such as servers and scaling up cloud infrastructure becomes even more inefficient if the catalog data needs to reside in multiple indices for multiple services, such as a search service and a recommendation service. Each service incurs the same increased need for storage and longer search and retrieval times.

Embodiments of the present invention address the technical problems by improving the functioning of the computer itself by providing a compression scheme to reduce the need for additional memory storage space and a hierarchical retrieval approach to reduce catalog item search retrieval times. Initially, catalog data is entered into an index where each row represents one catalog item. The number of columns reflects the number of fields associated with a catalog item. Each catalog item has an attributes field that can include open-ended text. When customer groups are taken into account and the catalog data is denormalized into the index, the index expands and becomes a computational bottleneck hindering efficient searching. An embodiment provides for a compression scheme that encodes catalog data for each catalog item into a fingerprint, which can also be known as an embedding.

After encoding catalog data into fingerprints the matrix is compressed to create a thin matrix, where the number of columns is much smaller than the initial number of columns. An embedding space is provided by training an autoencoder neural network on the catalog data to compress the number of columns in the original matrix to create the thin matrix.

Clustering the catalog items occurs after compression. The clustering operation results in related catalog items residing close to one another in the derived embedding space. Cluster centroids are used to compute the distance from an incoming query and determine which clusters are closest to the incoming query. The nearest clusters are searched to retrieve the catalog item that was the subject of the search. Searching the nearest clusters reduces search time and improves computational efficiency.

The technology described herein provides a number of advantages over existing technology. Computing resource consumption is improved relative to existing technologies. Searching cluster centroids is faster than searching items linearly in a database and is also faster than back propagation. Furthermore, embodiments described herein provide increased efficiency in content access, data management, and data transmission and reduces infrastructure and scaling costs.

Furthermore, aspects of the technology described herein improve storage device or disk I/O and query execution functionality, as they only need to go out to disk a single time (or fewer times relative to existing search technologies). As described above, the inefficiency of search results from existing technologies results in increased search times and memory storage. In contrast, aspects described herein reduce storage device space by storing the thin matrix and also reduces search time as the nearest clusters are searched in response to a query, whereas in existing technology the entire catalog index is searched.

Example System for Effective Stock Keeping Unit (SKU) Management

With reference now to the drawings, FIG. 1 is a block diagram illustrating an exemplary system 100 for effective SKU management in accordance with implementations of the present disclosure. It should be understood that this and other arrangements described herein are set forth only as examples. Other arrangements and elements (e.g., machines, interfaces, functions, orders, and groupings of functions, etc.) can be used in addition to or instead of those shown, and some elements can be omitted altogether. Further, many of the elements described herein are functional entities that can be implemented as discrete or distributed components or in conjunction with other components, and in any suitable combination and location. Various functions described herein as being performed by one or more entities can be carried out by hardware, firmware, and/or software. For instance, various functions can be carried out by a processor executing instructions stored in memory.

The system 100 is an example of a suitable architecture for implementing certain aspects of the present disclosure. Among other components not shown, the system 100 includes a user device 102 and an SKU management system 104. Each of the user device 102 and SKU management system 104 shown in FIG. 1 can comprise one or more computer devices, such as the computing device 700 of FIG. 7, discussed below. As shown in FIG. 1, the user device 102 and SKU management system 104 can communicate via a network 106, which can include, without limitation, one or more local area networks (LANs) and/or wide area networks (WANs). Such networking environments are commonplace in offices, enterprise-wide computer networks, intranets, and the Internet. It should be understood that any number of user devices and servers can be employed within the system 100 within the scope of the present invention. Each can comprise a single device or multiple devices cooperating in a distributed environment. For instance, the SKU management system 104 could be provided by multiple devices collectively providing the functionality of the SKU management system 104 as described herein. Additionally, other components not shown can also be included within the network environment.

At a high level, the SKU management system 104 includes a compression scheme that encodes catalog data for each catalog item. Once each catalog item is encoded catalog SKUs are clustered into groups where the distance between items reflects the similarities between them. A query can then be performed to search for the item using the embedding and computing the distance to the cluster centroids. The search can be refined within the nearest centroids to search for the exact match. As shown in FIG. 1, SKU management system 104 includes compression module 108, cluster module 110, and search module 112. These components can be in addition to other components that provide further additional functions beyond the features described herein.

The UI module 104 can be implemented using one or more devices, one or more platforms with corresponding application programming interfaces, cloud infrastructure, and the like. While the SKU management system 104 is shown separate from the user device 102 in the configuration of FIG. 1, it should be understood that in other configurations, some or all of the functions of the SKU management system 104 can be provided on the user device 102.

The compression module 108 encodes the catalog data into a fingerprint, or an embedding. Each catalog item has its own fingerprint. The complete catalog for the merchant is stored in an index, which can be understood as a matrix of dimensions m×n, where m is the number of rows and n is the number of columns. M represents the number of catalog items and n represents the number of fields associated with a catalog item. Each catalog item has an attributes field, an open-ended text field that can include any number of item descriptors or attributes.

When customer groups are considered and the catalog data is denormalized into the index, the number of rows of the original m×n matrix increases from m to m*g, where g is the number of customer groups. This matrix can be exhaustively large and can pose computational and resource challenges. The compression module 108 compresses the matrix to form a "thin" matrix where the number of columns is much smaller than n. The compression module 108 also derives an embedding space that is trained on the catalog data to compress the number of columns.

The cluster module 110 clusters the catalog items that are represented in the embedding space. In the embedding space related items are close to each other. The cluster module 110 uses cluster centroids to compute the distance from an incoming query to the clusters and to find the clusters closest to the incoming query. After the cluster module 110 computes the distance from the incoming query the search module 112 searches the closest clusters to retrieve an item in response to the query. The search module 112 uses the fingerprint to search for the requested item.

The user interface (UI) module 114 provides a user interface to user devices, such as the user device 102, for interacting with the SKU management system 104. For instance, the UI module 114 can provide user interfaces for receiving a catalog item number of SKU for processing. Additionally, the UI module 114 can provide user interfaces for receiving input about the catalog item. For instance the user interfaces can allow a user to specify a size, color, or style of the catalog item. Further the UI module 114 can provide output comprising an image of the item or further information, such as stock on hand.

The user device 102 can be any type of computing device, such as, for instance, a personal computer (PC), tablet computer, desktop computer, mobile device, or any other suitable device having one or more processors. As shown in FIG. 1, the user device 102 includes an application 116 for interacting with the SKU management system 104. The application 116 can be, for instance, a web browser or a dedicated application for interacting with the SKU management system 104. For instance, the application 116 can present user interfaces provided by the SKU management system 104, allowing a user to provide inputs, such as an item number and receive output, such as an image of the catalog item.

Figure 2:
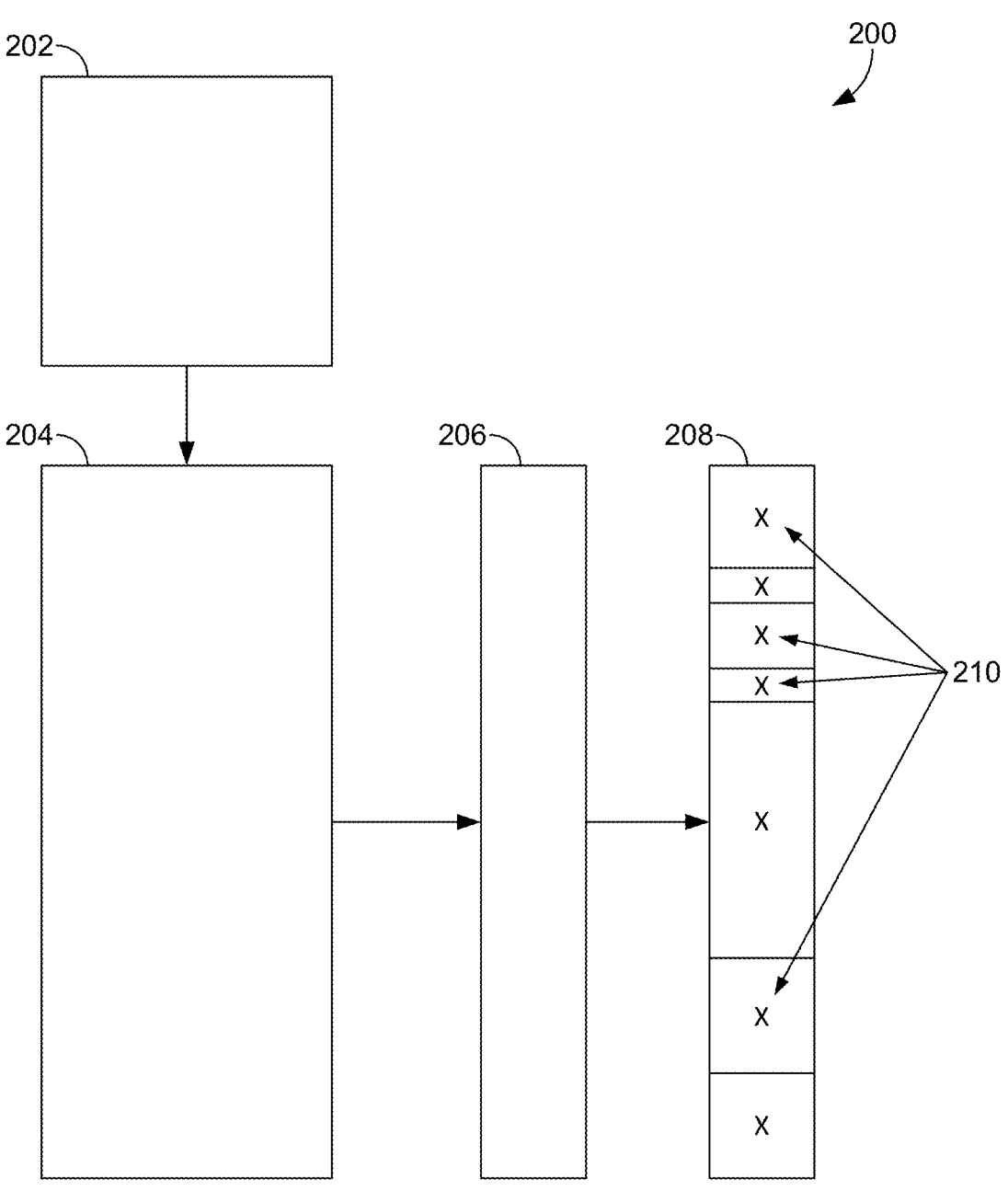
FIG. 2 depicts a compressed and clustered index, in accordance with some implementations of the present disclosure.

FIG. 2 shows how a compressed and clustered index is created. The clustered index generation process 200 begins with an index 202, which consists of the merchant catalog information, including SKUs. The index 202 is a matrix of dimensions m×n, where m is the number of rows and n is the number of columns. The number of rows m represents the number of catalog items in a merchant's catalog. Merchants can have multiple catalogs and each catalog can offer different products or prices to different customers. Some catalogs focus on business-to-business sales, while others focus on customer affinity groups. Each catalog can include thousands or more SKUs. Furthermore, each catalog item can have an attribute field, an open-ended text field that can include any number of item descriptors or attributes. The attribute field can describe various sizes, colors, or features of a catalog item.

The catalog data and customer group data can be denormalized into the index 202, to produce the matrix with customer groups 204. Normalizing the catalog data and customer group data results in the original m×n matrix row count expanding from m to m*g, where g is the number of customer groups. The dimensions of the matrix with customer groups is now m*g×n, where the number of rows is m*g and the number of columns is n. This matrix with customer groups 204 can be exhaustively large and strain computational and storage resources.

Once the matrix with customer groups 204 has been created it is compressed to form a matrix where the number of columns is much smaller than n. This thin matrix 206 contains compressed documents, shrinking the size of the matrix with customer groups 204. The compression module 108 of FIG. 1 performs the compression. The compression can be accomplished by deriving an embedding space that is trained on the catalog data to compress the number of columns.

Once the compression is completed the thin matrix 206 is clustered by the cluster module 110 of FIG. 1. The clustering operation ensures that related items reside close to one another in the derived embedding space. Clustering produces the clustered matrix 208. The clustered matrix 208 contains cluster centroids 210 that are used to compute the distance from an incoming query to the cluster centroids 210 to find the clusters closest to the query. Using the cluster centroids 210 to search allows searching the closes clusters to retrieve the specific item requested by the query.

Figure 3:
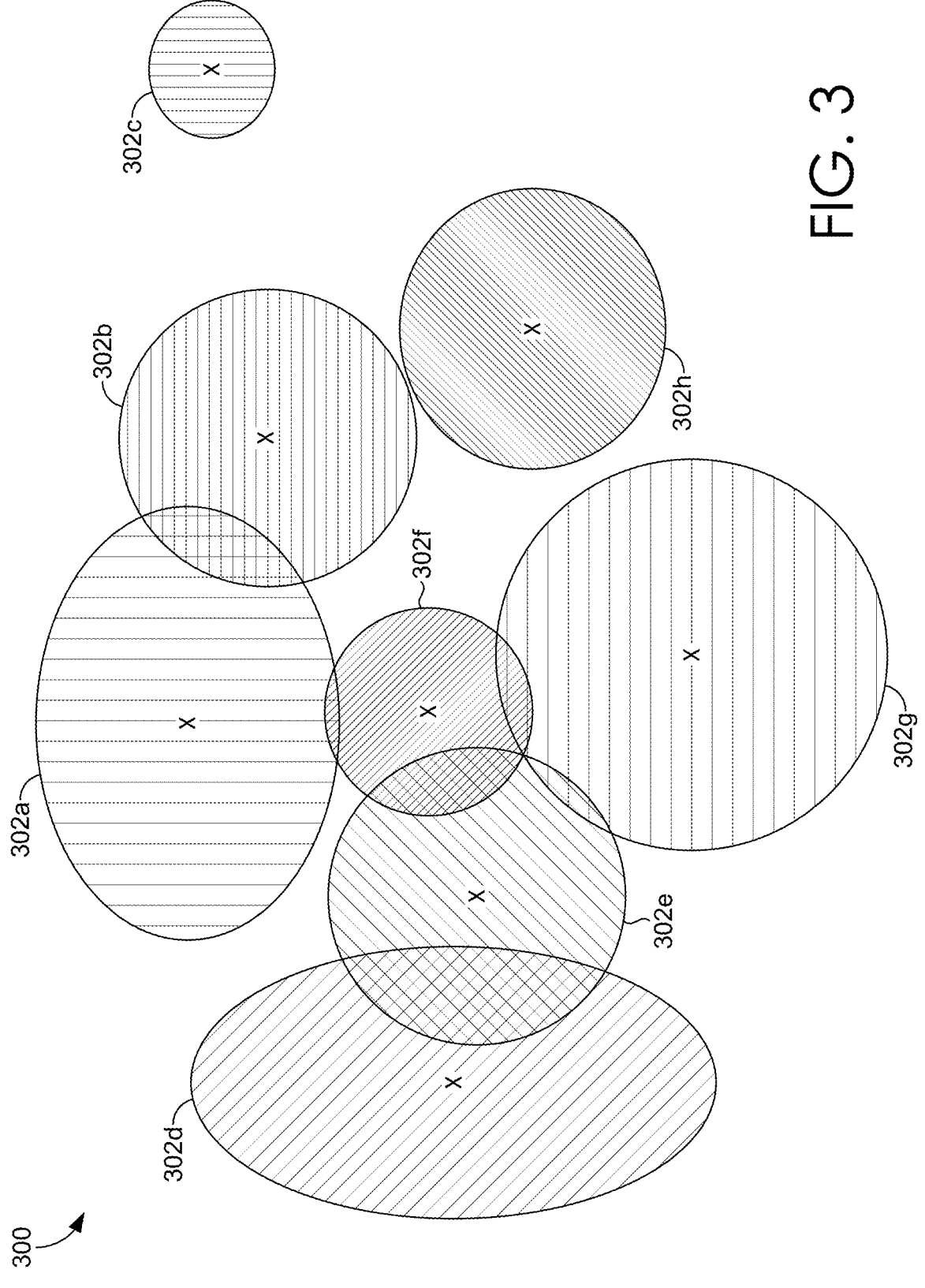
FIG. 3 is a schematic of a clustered index in accordance with some implementations of the present disclosure.

FIG. 3 is a schematic diagram of a clustered index, in accordance with some implementations of the present disclosure. The clustered index 300 includes individual clusters 302a-302h. The individual clusters 302a-302h are shown as circles or bubbles in FIG. 3. The centroids of each individual cluster 302a-302h are marked with "x". The centroids of the individual clusters 302a-302h can be denoted by the variables C1, C2, C3 . . . Cn, where n is the number of centroids. The cardinality, or number of items of each cluster can be denoted N1, N2, . . . Nn. When a query is submitted to the clustered index 300, the distance from the fingerprint or embedding of item X to the centroid of each of the individual clusters 302a-302h is computed. The cluster centroid closest to Z and its neighboring clusters is then found. At that point, all other clusters are discarded. The search is then refined the search is confined to search within the retrieved clusters. The result is conservation of computing resources as only the clusters closest are searched.

Figure 4:
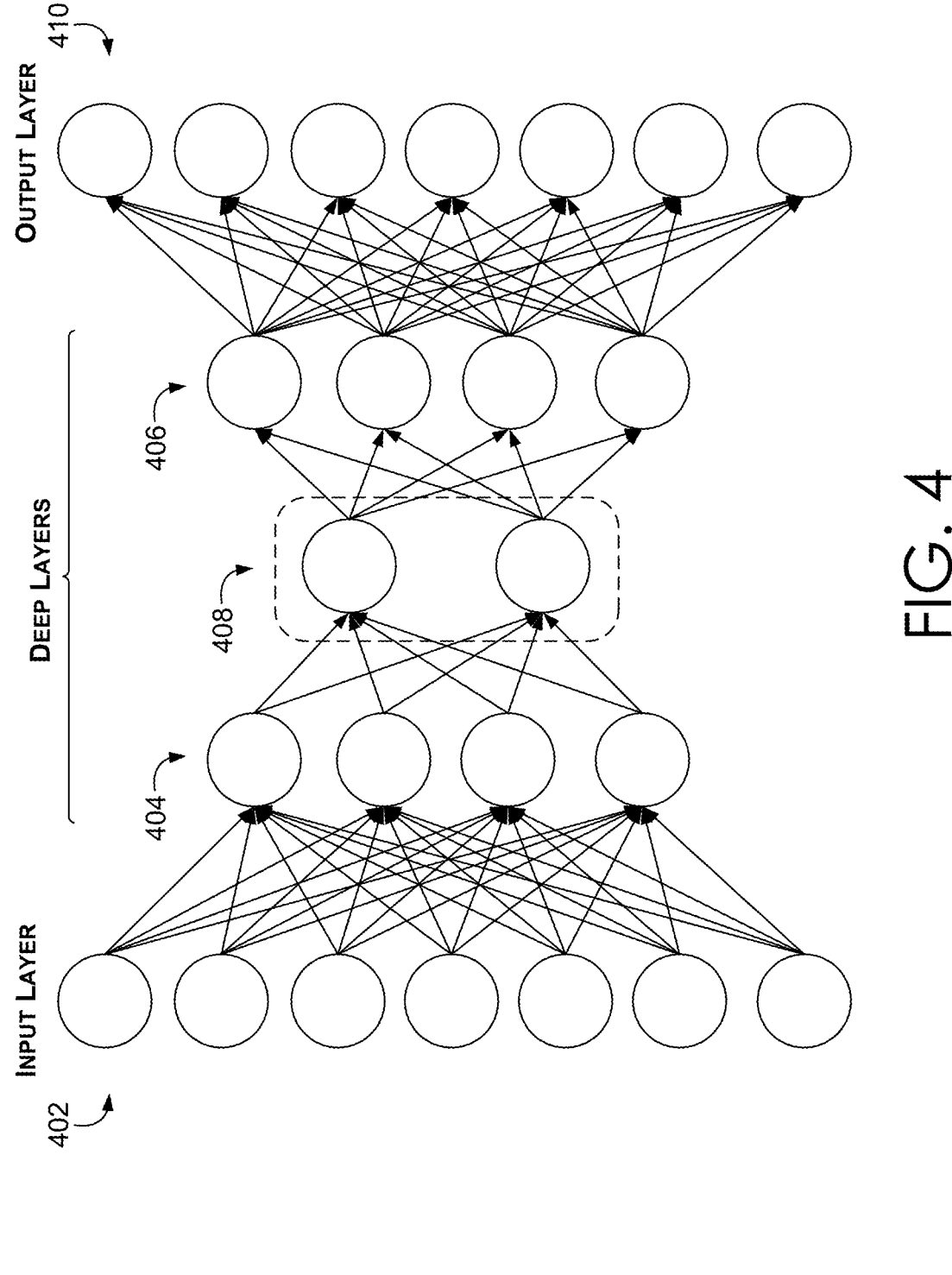
FIG. 4 illustrates an autoencoder structure in accordance with some implementations of the present disclosure.

FIG. 4 illustrates an autoencoder neural network structure that is trained on the catalog data to derive catalog item fingerprints or embeddings. Using a feedforward network is faster than backpropagation and also faster than searching for items linearly in a database. During the training phase a merchant's catalog entries are used to train an autoencoder where a catalog item represents an input layer 402. The input layer 402 is the first layer in the neural network. All of the items in the merchant's catalog are used to train the network. Once the training phase is complete, the deep layers, first deep layers 404 in FIG. 4, is learned and used in a feedforward computation that then determines the fingerprints corresponding to each catalog item. Multiple first input layers 402 feed input to the compression layers 408. The compression layers 408 output compressed data to second deep layers 406. Second deep layers 406 output data to output layers 410. The dimensionality of the first deep layers 404 and the second deep layers 406 can be chosen to be significantly smaller than that of the first deep layer 404 and the second deep layer 406 as well as the output layers 410.

Figure 5:
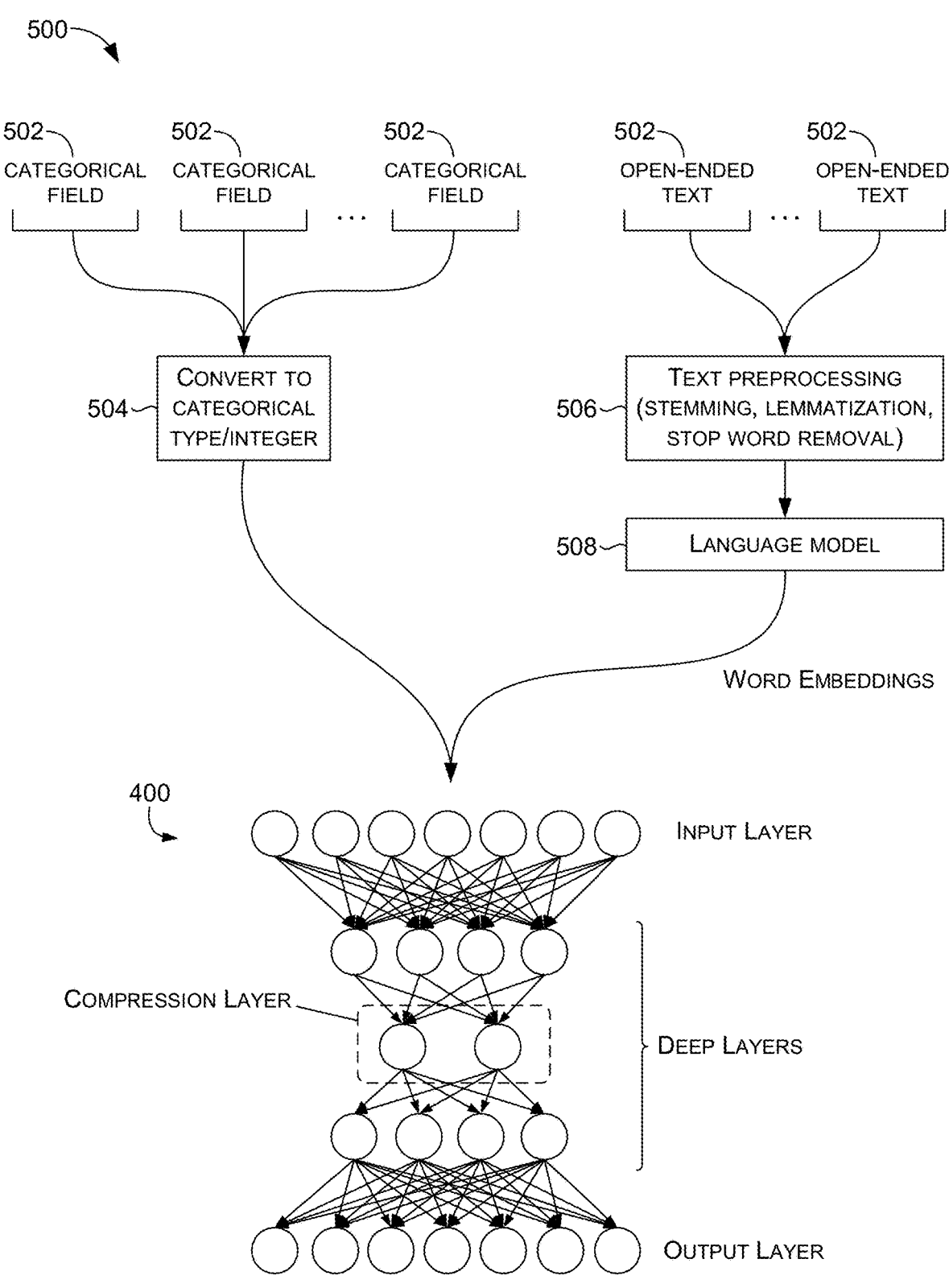
FIG. 5 is a schematic of numerical representation submitted to an auto encoder network in accordance with some implementations of the present disclosure.

Each catalog item should be represented numerically before submission to the autoencoder network. FIG. 5 shows a schematic of the process of creating the numerical representation 500 submitted to the autoencoder network. The fields that constitute a catalog item can be categorical, numerical, or open-ended text. Categorical fields can be transformed to categorical types, integers, or a one-hot binary vector. To give an example, for a categorical field 502 representing one of three categories the representation could be 001, 010, or 100.

The categorical fields 502 can be converted to categorical type/integer by the convert to categorical type/integer module 504. The convert to categorical type/integer module 504 also performs the concatenation to form one large dimensional vector. The open-ended text fields 503 can be pre-processed by stemming, lemmatization, and stop word removal performed by the text pre-processing module 506. The text pre-processing module 506 provides the input to the language model 508. The language mode transforms the output of the convert to categorical type/integer module 504 and language model 508 to a numerical embedding or fingerprint. After the fingerprints have been created they are submitted to the autoencoder 400.

An autoencoder 400 is one approach to encoding the catalog items. In an alternative, a hash table can be used to perform a similar function. The criteria for the hash function is efficiently decoding the embedding or fingerprint. A further alternative uses one-hot encoding in place of the language model 508. One-hot encoding can be used to create a dictionary of all the words appearing in a merchant's catalog after stemming, lemmatization, and stop word removal. The catalog data can then be pivoted such that higher level concepts such as attributes and categories are expanded into dimensions in a very large dimensional space. Individual catalog items can then be represented as sparse large dimensional vectors. The sparsity renders the dimensional vectors more compressible.

Example Methods for Effective Stock Keeping Unit (SKU) Management

Figure 6:
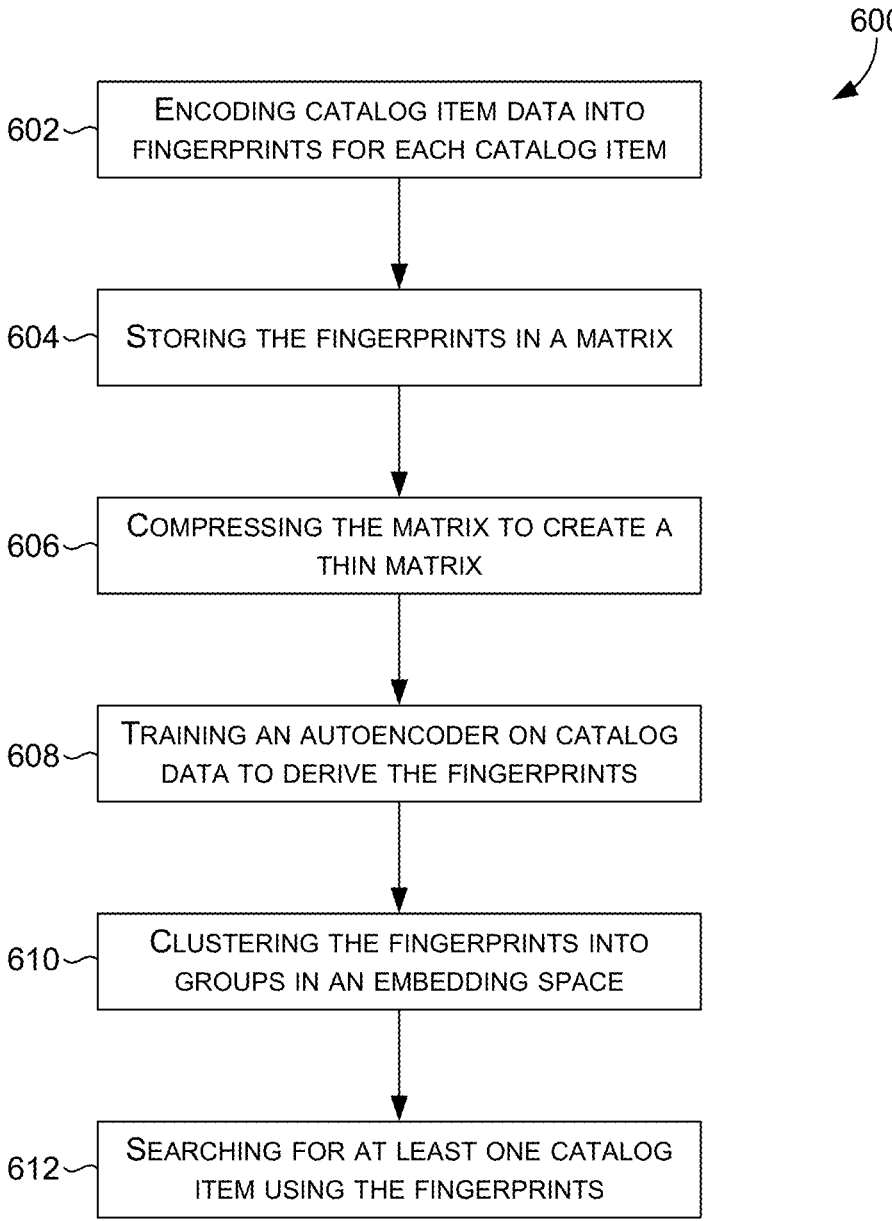
FIG. 6 is a flow diagram showing a method for effective stock keeping unit (SKU) management, in accordance with some implementations of the present disclosure.

With reference now to FIG. 6, a flow diagram is provided that illustrates a method 600 for effective SKU management. The method 600 can be performed, for instance, by the SKU management system 104 of FIG. 1. Each block of the method 600 and any other methods described herein comprises a computing process performed using any combination of hardware, firmware, and/or software. For instance, various functions can be carried out by a processor executing instructions stored in memory. The methods can also be embodied as computer-usable instructions stored on computer storage media. The methods can be provided by a standalone application, a service or hosted service (standalone or in combination with another hosted service), or a plug-in to another product, to name a few.

As shown at block 602, the method begins with encoding catalog data into a fingerprint per catalog item. The catalog data includes a SKU for each catalog item, which can include categorical fields as well as text fields. The encoding process can include creating a matrix based on the catalog data. The catalog data can be expanded or denormalized when the matrix is created. This matrix can be extremely large and time-consuming to search. The matrix is then compressed to form a thin matrix. The embedding space can be trained, using machine learning, such as an autoencoder, to compress the number of columns. Next, in block 604 the fingerprints are clustered into groups in an embedding space. In the embedding space a distance between the fingerprints encodes item similarity. Similar items are grouped closer together. The clustering produces cluster groups of similar or related items. A centroid is computed for each cluster. Then, in block 606, searching for the catalog item using the fingerprints occurs with only the closest clusters searched.

Exemplary Operating Environment

Figure 7:
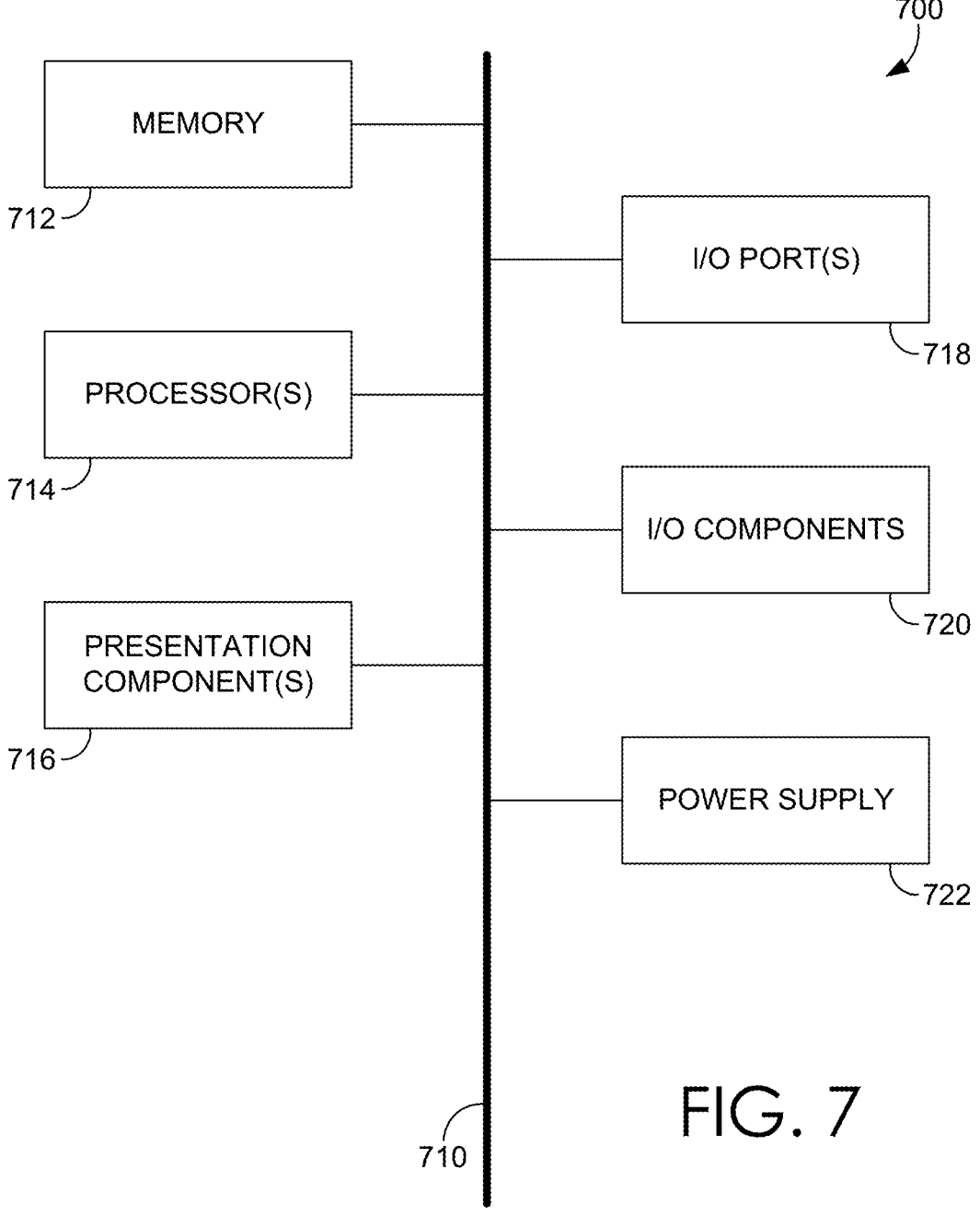
FIG. 7 is a block diagram of an exemplary computing environment suitable for use in implementations of the present disclosure.

Having described implementations of the present disclosure, an exemplary operating environment in which embodiments of the present invention can be implemented is described below in order to provide a general context for various aspects of the present disclosure. Referring initially to FIG. 7 in particular, an exemplary operating environment for implementing embodiments of the present invention is shown and designated generally as computing device 700. Computing device 700 is but one example of a suitable computing environment and is not intended to suggest any limitation as to the scope of use or functionality of the invention. Neither should the computing device 700 be interpreted as having any dependency or requirement relating to any one or combination of components illustrated.

The invention can be described in the general context of computer code or machine-useable instructions, including computer-executable instructions such as program modules, being executed by a computer or other machine, such as a personal data assistant or other handheld device. Generally, program modules including routines, programs, objects, components, data structures, etc., refer to code that perform particular tasks or implement particular abstract data types. The invention can be practiced in a variety of system configurations, including hand-held devices, consumer electronics, general-purpose computers, more specialty computing devices, etc. The invention can also be practiced in distributed computing environments where tasks are performed by remote-processing devices that are linked through a communications network.

With reference to FIG. 7, computing device 700 includes bus 710 that directly or indirectly couples the following devices: memory 712, one or more processors 714, one or more presentation components 716, input/output (I/O) ports 718, input/output components 720, and illustrative power supply 722. Bus 710 represents what can be one or more busses (such as an address bus, data bus, or combination thereof). Although the various blocks of FIG. 7 are shown with lines for the sake of clarity, in reality, delineating various components is not so clear, and metaphorically, the lines would more accurately be grey and fuzzy. For example, one can consider a presentation component such as a display device to be an I/O component. Also, processors have memory. The inventors recognize that such is the nature of the art, and reiterate that the diagram of FIG. 7 is merely illustrative of an exemplary computing device that can be used in connection with one or more embodiments of the present invention. Distinction is not made between such categories as "workstation," "server," "laptop," "hand-held device," etc., as all are contemplated within the scope of FIG. 7 and reference to "computing device."

Computing device 700 typically includes a variety of computer-readable media. Computer-readable media can be any available media that can be accessed by computing device 700 and includes both volatile and nonvolatile media, removable and non-removable media. By way of example, and not limitation, computer-readable media can comprise computer storage media and communication media. Computer storage media includes both volatile and nonvolatile, removable and non-removable media implemented in any method or technology for storage of information such as computer-readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by computing device 700. Computer storage media does not comprise signals per se. Communication media typically embodies computer-readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of any of the above should also be included within the scope of computer-readable media.

Memory 712 includes computer storage media in the form of volatile and/or nonvolatile memory. The memory can be removable, non-removable, or a combination thereof. Exemplary hardware devices include solid-state memory, hard drives, optical-disc drives, etc. Computing device 700 includes one or more processors that read data from various entities such as memory 712 or I/O components 720. Presentation component(s) 716 present data indications to a user or other device. Exemplary presentation components include a display device, speaker, printing component, vibrating component, etc.

I/O ports 718 allow computing device 700 to be logically coupled to other devices including I/O components 720, some of which can be built in. Illustrative components include a microphone, joystick, game pad, satellite dish, scanner, printer, wireless device, etc. The I/O components 720 can provide a natural user interface (NUI) that processes air gestures, voice, or other physiological inputs generated by a user. In some instance, inputs can be transmitted to an appropriate network element for further processing. A NUI can implement any combination of speech recognition, touch and stylus recognition, facial recognition, biometric recognition, gesture recognition both on screen and adjacent to the screen, air gestures, head and eye-tracking, and touch recognition associated with displays on the computing device 700. The computing device 700 can be equipped with depth cameras, such as, stereoscopic camera systems, infra-red camera systems, RGB camera systems, and combinations of these for gesture detection and recognition. Additionally, the computing device 700 can be equipped with accelerometers or gyroscopes that enable detection of motion.

Aspects of the present invention have been described in relation to particular embodiments, which are intended in all respects to be illustrative rather than restrictive. Alternative embodiments will become apparent to those of ordinary skill in the art to which the present invention pertains without departing from its scope.

Having identified various components utilized herein, it should be understood that any number of components and arrangements can be employed to achieve the desired functionality within the scope of the present disclosure. For example, the components in the embodiments depicted in the figures are shown with lines for the sake of conceptual clarity. Other arrangements of these and other components can also be implemented. For example, although some components are depicted as single components, many of the elements described herein can be implemented as discrete or distributed components or in conjunction with other components, and in any suitable combination and location. Some elements can be omitted altogether. Moreover, various functions described herein as being performed by one or more entities can be carried out by hardware, firmware, and/or software, as described below. For instance, various functions can be carried out by a processor executing instructions stored in memory. As such, other arrangements and elements (e.g., machines, interfaces, functions, orders, and groupings of functions) can be used in addition to or instead of those shown.

Embodiments described herein can be combined with one or more of the specifically described alternatives. In particular, an embodiment that is claimed can contain a reference, in the alternative, to more than one other embodiment. The embodiment that is claimed can specify a further limitation of the subject matter claimed.

The subject matter of embodiments of the invention is described with specificity herein to meet statutory requirements. However, the description itself is not intended to limit the scope of this patent. Rather, the inventors have contemplated that the claimed subject matter might also be embodied in other ways, to include different steps or combinations of steps similar to the ones described in this document, in conjunction with other present or future technologies. Moreover, although the terms "step" and/or "block" can be used herein to connote different elements of methods employed, the terms should not be interpreted as implying any particular order among or between various steps herein disclosed unless and except when the order of individual steps is explicitly described.

For purposes of this disclosure, the word "including" has the same broad meaning as the word "comprising," and the word "accessing" comprises "receiving," "referencing," or "retrieving." Further, the word "communicating" has the same broad meaning as the word "receiving," or "transmitting" facilitated by software or hardware-based buses, receivers, or transmitters using communication media described herein. In addition, words such as "a" and "an," unless otherwise indicated to the contrary, include the plural as well as the singular. Thus, for example, the constraint of "a feature" is satisfied where one or more features are present. Also, the term "or" includes the conjunctive, the disjunctive, and both (a or b thus includes either a or b, as well as a and b).

For purposes of a detailed discussion above, embodiments of the present invention are described with reference to a distributed computing environment; however, the distributed computing environment depicted herein is merely exemplary. Components can be configured for performing novel embodiments of embodiments, where the term "configured for" can refer to "programmed to" perform particular tasks or implement particular abstract data types using code. Further, while embodiments of the present invention can generally refer to the technical solution environment and the schematics described herein, it is understood that the techniques described can be extended to other implementation contexts.

From the foregoing, it will be seen that this invention is one well adapted to attain all the ends and objects set forth above, together with other advantages which are obvious and inherent to the system and method. It will be understood that certain features and subcombinations are of utility and can be employed without reference to other features and subcombinations. This is contemplated by and is within the scope of the claims.

What is claimed is:

1. A computer-implemented method comprising:

generating an embedding space by compressing fingerprints of catalog items;

clustering the fingerprints of catalog items into centroids in the embedding space; and responsive to an incoming query:

searching the centroids of the embedding space for a catalog item using the fingerprints of catalog items by computing a distance from the incoming query to determine the centroids closest to the incoming query and searching the centroids closest to the incoming query for the catalog item; and providing corresponding data of the catalog item in response to the incoming query.

2. The computer-implemented method of claim 1, further comprising:

generating an index, where a number of rows represents a number of catalog items and a number of columns represents a number of fields associated with each catalog item of the catalog items;

denormalizing the index using customer groups; and transforming the index by compressing the number of columns to produce the embedding space.

3. The computer-implemented method of claim 1, further comprising training an autoencoder on catalog item data to generate the embedding space.

4. The computer-implemented method of claim 1, further comprising encoding item similarity to place related items close to each other in the embedding space.

5. The computer-implemented method of claim 1, wherein generating the embedding space further comprises:

encoding catalog item data into the fingerprints of catalog items, each fingerprint corresponding to a corresponding catalog item from the catalog item data;

storing the fingerprints of catalog items in a matrix; and compressing the matrix to create a thin matrix.

6. The computer-implemented method of claim 5, wherein the catalog item data comprises data fields that are categorical, numerical, or open-ended text.

7. The computer-implemented method of claim 6, wherein the categorical data fields are transformed to categorical types, integers, or one-hot binary vectors.

8. The computer-implemented method of claim 6, wherein the open-ended text fields are pre-processed by stemming, lemmatization, and stop word removal.

9. The computer-implemented method of claim 8, further comprising transforming the pre-processed text fields into a numerical fingerprint.

10. The computer-implemented method of claim 9, further comprising concatenating the transformed text fields to form a dimensional vector.

11. The computer-implemented method of claim 10, further comprising using the dimensional vector as an input layer for training an autoencoder on the catalog item data to derive the fingerprints of catalog items.

12. One or more computer storage media storing instructions that, when used by one or more processors, cause the one or more processors to perform operations, the operations comprising:

generating an embedding space by encoding catalog item data into fingerprints for each catalog item of a number of catalog items and compressing the fingerprints, each catalog item corresponding to a corresponding fingerprint of the fingerprints;

clustering the fingerprints into centroids in the embedding space; and responsive to an incoming query:

searching the centroids of the embedding space for a catalog item using the fingerprints by computing a distance from the incoming query to determine the centroids closest to the incoming query and searching the centroids closest to the incoming query for the catalog item; and providing corresponding data of the catalog item in response to the incoming query.

13. The computer storage media of claim 12, further comprising:

generating an index, where a number of rows represents the number of catalog items and a number of columns represents a number of fields associated with each catalog item;

denormalizing the index using customer groups; and transforming the index by compressing the number of columns to produce the embedding space.

14. The computer storage media of claim 12, further comprising training an autoencoder on the catalog item data to generate the embedding space.

15. The computer storage media of claim 12, wherein generating the embedding space further comprises:

storing the fingerprints in a matrix; and compressing the matrix to create a thin matrix.

* * * * *